(12) United States Patent
Frazier

(10) Patent No.: US 6,189,876 B1
(45) Date of Patent: *Feb. 20, 2001

(54) METHOD AND APPARATUS FOR LEVELING THE UPPER SURFACE OF A PCB

(75) Inventor: Rodney Dean Frazier, Nampa, ID (US)

(73) Assignee: MCMS, Inc., Nampa, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/073,149

(22) Filed: May 5, 1998

(51) Int. Cl.[7] .................................................. B25B 11/00
(52) U.S. Cl. .................................. 269/21; 29/559; 29/759; 269/71; 269/43
(58) Field of Search ...................... 29/559, 759; 269/903, 269/30, 71, 60, 43, 61, 32, 21

(56) References Cited

U.S. PATENT DOCUMENTS 1,198,402 * 9/1916 Bagnall .
2,504,609 * 4/1950 Williams ................................. 269/30
4,142,286 * 3/1979 Knuth et al. .
4,567,938 * 2/1986 Turner ................................... 269/903
5,544,872 * 8/1996 Schuit ..................................... 269/60

* cited by examiner

Primary Examiner—S. Thomas Hughes
Assistant Examiner—Steve Blount
(74) Attorney, Agent, or Firm—Dorsey & Whitney LLP

(57) ABSTRACT

A platform and method for leveling the upper surface of a printed circuit board placed upon a work table. The platform comprises a substantially flat plate, the plate having a fastener for planerly securing the printed circuit board thereto, and at least one support having a length between a first end and a second end, the second end of the at least one support attached to the plate, and wherein the length of the at least one support is selected such that an angle between the plate and the work table compensates for any angular displacement of the printed circuit board relative to the plate. The method comprises fastening the printed circuit board to a platform, securing the platform to the work table, and angularly adjusting the upper surface of the printed circuit board by altering an angle between the platform and the work table.

22 Claims, 5 Drawing Sheets

Fig. 1

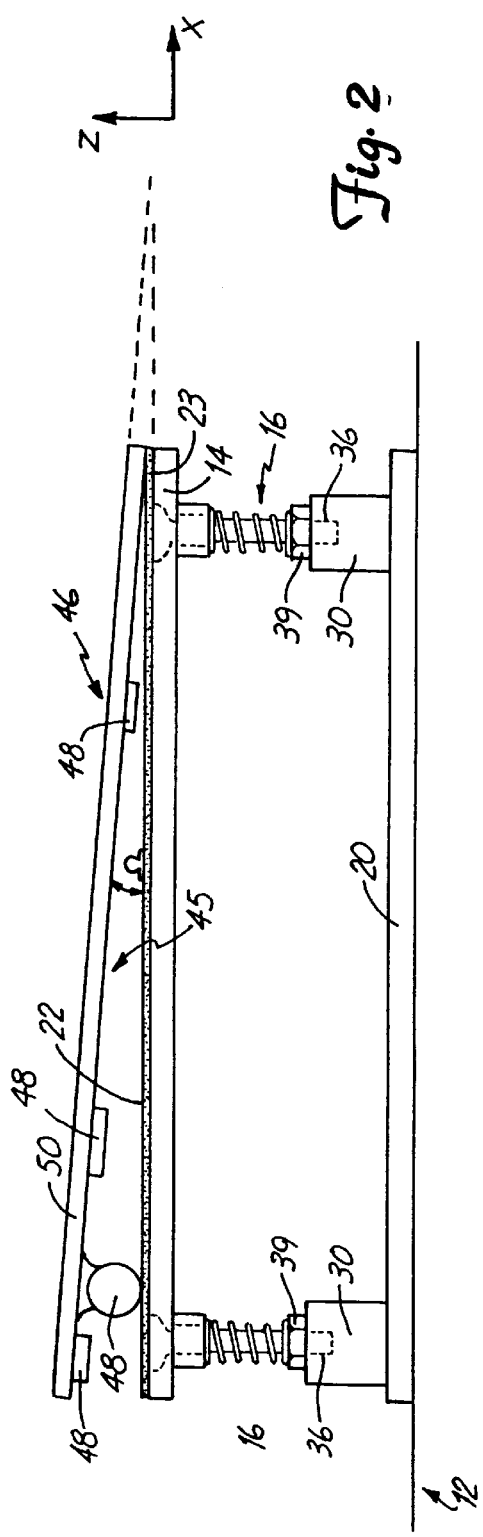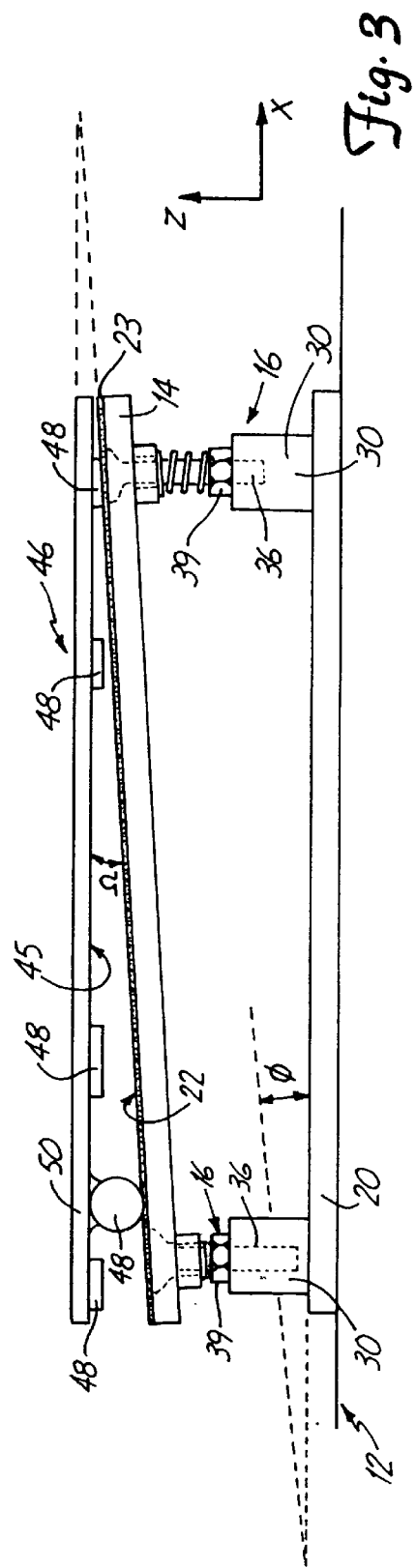

METHOD AND APPARATUS FOR LEVELING THE UPPER SURFACE OF A PCB

BACKGROUND OF THE INVENTION

1. Field of the Invention

This invention relates to devices and methods for handling printed circuit boards during manufacturing processes. More particularly, this invention relates to an apparatus and methods for leveling the upper surface of a printed circuit board on the tooling table of a pick-and-place machine.

2. Background Information

Pick-and-place machines are commonly used to mount components, such as integrated circuit chips, capacitors, and resistors, onto printed circuit boards (PCBs). The use of pick-and-place machines to increase the speed with which components are surface-mounted to PCBs is well known in the art. Pick-and-place machines remove components from a stored position or a feeder, align the components with the PCB, and place the components in the proper position on the PCB. Pick-and-place machines are used to populate both single-sided and double-sided PCBs.

The pick-and-place machine contains a device, such as a robotic arm, to move components from stored positions to the PCB surface. The robotic arm typically contains a gripping mechanism, such as a suction nozzle head, to grip components in the stored position and transport them to the PCB. Some pick-and-place machines have robotic arms that move in the X and Y-axes only, while other pick-and-place machines have robotic arms that move in the Z-axis or in a combination of all three axes.

To ensure the proper placement of components on the PCB, the alignment of the PCB with the pick-and-place machine, in particular the robotic arm, must be calibrated. The PCB is secured to the tooling table of the pick-and-place machine to ensure a fixed alignment of the PCB on the table. The tooling table may then be adjusted in the X, Y, and Z axes and examined by eye for proper positioning. Proper positioning of the PCB on the tooling table allows the robotic arm head to pick up a component from the stored position, scan the PCB, and then place the component in the proper position on the PCB.

The use of part decryption generators (PDGs) to populate PCBs with components is well-known in the art. A PDG is a program that instructs the pick-and-place machine where to place specific components on the PCB surface. The PDG also directs a camera or similar scanning device, which may be mounted on the robotic arm head, to scan the PCB surface. The PDG uses the results of this scan as a location guide for placement of components on the PCB surface.

When the PDG uses the robotic arm head to scan the PCB, it reads a Z-level where it contacts the PCB and assumes this level to be constant over the entire upper surface of the PCB. If the upper surface of the PCB is not at a fixed Z-level, i.e., is uneven due to warping, thickness variations or other abnormalities, the PDG will improperly place components on the PCB. If the PDG assumes a constant Z-level and some areas of the PCB are above or below that level, components in those areas will not be placed at the correct Z depth. With current pick-and-place equipment, an average of about ten percent of components are misplaced if the upper surface of the PCB is not level, and up to seventy-five percent of components may be misplaced in a severe case. The improper placement of components on PCBs not only causes problems with the success of PCB production, but the nozzle heads of the pick-and-place machine's robotic arm may be damaged by overdriving parts into PCBs.

The pick-and-place machine industry has provided mounting pins and clamps to hold PCBs to the tooling tables. The mounting pins are commonly solid pin dowels that thread into fixed locations in the tooling table. The height of the mounting pins may be adjusted by threading the pins into or out of the tooling table. The PCB may then be placed upon the mounting pins. Some pick-and-place machines provide clamps to pinch the PCB from the top above each of the mounting pins to support the PCB. Other pick-and-place machines come with a suction securing system. In these systems the mounting pins have holes drilled in them. The bottom side of each mounting pin is connected to a vacuum supply to create suction forces on the upper side of the mounting pin where it contacts the PCB. The suction forces hold the PCB down to the mounting pins, which in some cases may permit correction of warping.

There are a number of problems that result from securing PCBs to tooling tables with mounting pins. Double-sided PCBs contain components on the bottom side after population of one side with components. Because the mounting pins may only be placed at fixed positions in the tooling table of the pick-and-place machine, the mounting pins may contact the PCB where fragile components, such as capacitors, have been mounted. This contact may damage the components.

Another problem with the use of mounting pins is the difficulty in flattening out the upper surface of PCBs that are warped. Mounting pins secure the PCB by grasping the PCB from the top and from the bottom. The use of a plurality of mounting pins to support a PCB may not flatten out the PCB and remove the warping from its upper surface. Even a plurality of properly placed mounting pins may not be able to remove the warping from a large PCB because it is difficult to stretch or flatten out the PCB with mounting pins that provide only vertical support at limited points of contact. The use of mounting pins may cause some areas of the PCB to sag so that the upper surface of the PCB is not flat.

Yet another problem with the use of mounting pins to support PCBs upon tooling tables is the difficulty in achieving a repeatable flat surface for the PCB. If the pick-and-place machine is used to populate a different size or type of PCB, the location and height of the mounting pins will need to be modified to accommodate the new PCB. The mounting pins will have to be positioned and adjusted from scratch the next time the first line of PCBs is to be populated. A related problem results if one pick-and-place machine is set up for population of a given PCB line and it is desired to use a different pick-and-place machine for population of that PCB line. The mounting pin placement on the new pick-and-place machine will have to be adjusted from scratch to achieve the proper Z-level.

A need exists for a method and apparatus to provide a level upper surface for PCBs during population of components using pick-and-place machines that is repeatable, may be used for different pick-and-place machines with minimal effort, and that does not damage components on double-sided PCBs.

SUMMARY OF THE INVENTION

This invention comprises a platform and a method for leveling the upper surface of a printed circuit board placed upon a work table. In one embodiment, the platform comprises a substantially flat plate, the plate having a fastener for planerly securing the printed circuit board thereto, and at least one support having a length between a first end and a second end. The second end of the at least one support is attached to the plate, and the length of the at least one support is selected such that an angle between the plate and the work table compensates for any angular displacement of the printed circuit board relative to the plate. Another embodiment of the invention comprises a suction system as the fastener to secure the printed circuit board to the plate. Another embodiment of the invention comprises a plurality of legs that are adjustable.

Yet another embodiment of the invention is a platform comprising a flat plate, a suction system to planerly secure the printed circuit board to the plate, a base adapted to be mounted to the work table, and a plurality of supports having lengths between first ends and second ends. The first ends of the supports are connected to the base, the second ends connected to the plate, and the lengths of the plurality of supports are selected such that an angle between the plate and the work table compensates for any angular displacement of the printed circuit board relative to the plate.

Another embodiment of the invention is a method comprising the acts of fastening the printed circuit board to a platform, securing the platform to the work table, and angularly adjusting the upper surface of the printed circuit board by altering an angle between the platform and the work table. In another embodiment of the invention the act of fastening comprises suctioning the printed circuit board to the platform to planerly secure the printed circuit board to the platform.

Yet another embodiment of the invention comprises a method for reproducibly leveling the upper surface of a printed circuit board placed upon a work table. This embodiment of the invention comprises the acts of fastening a template to a plate, securing the plate to the work table, angularly adjusting the upper surface of the template by altering an angle between the plate and the work table, and replacing the template with the printed circuit board. Another embodiment of this invention comprises the act of drilling at least one hole in the template and rotating a bolt through the at least one hole in the template to adjust the length of the at least one support.

DESCRIPTION OF THE DRAWINGS

FIG. 1 is a perspective view of one embodiment of the platform of the invention;

FIG. 2 is a front view of the embodiment shown in FIG. 1 that illustrates a PCB on the platform where the upper surface of the PCB requires leveling;

FIG. 3 is a front view of the embodiment shown in FIG. 1 that illustrates a PCB on the platform where the upper surface of the PCB has been leveled to a constant Z-depth;

DETAILED DESCRIPTION

Figure 1:
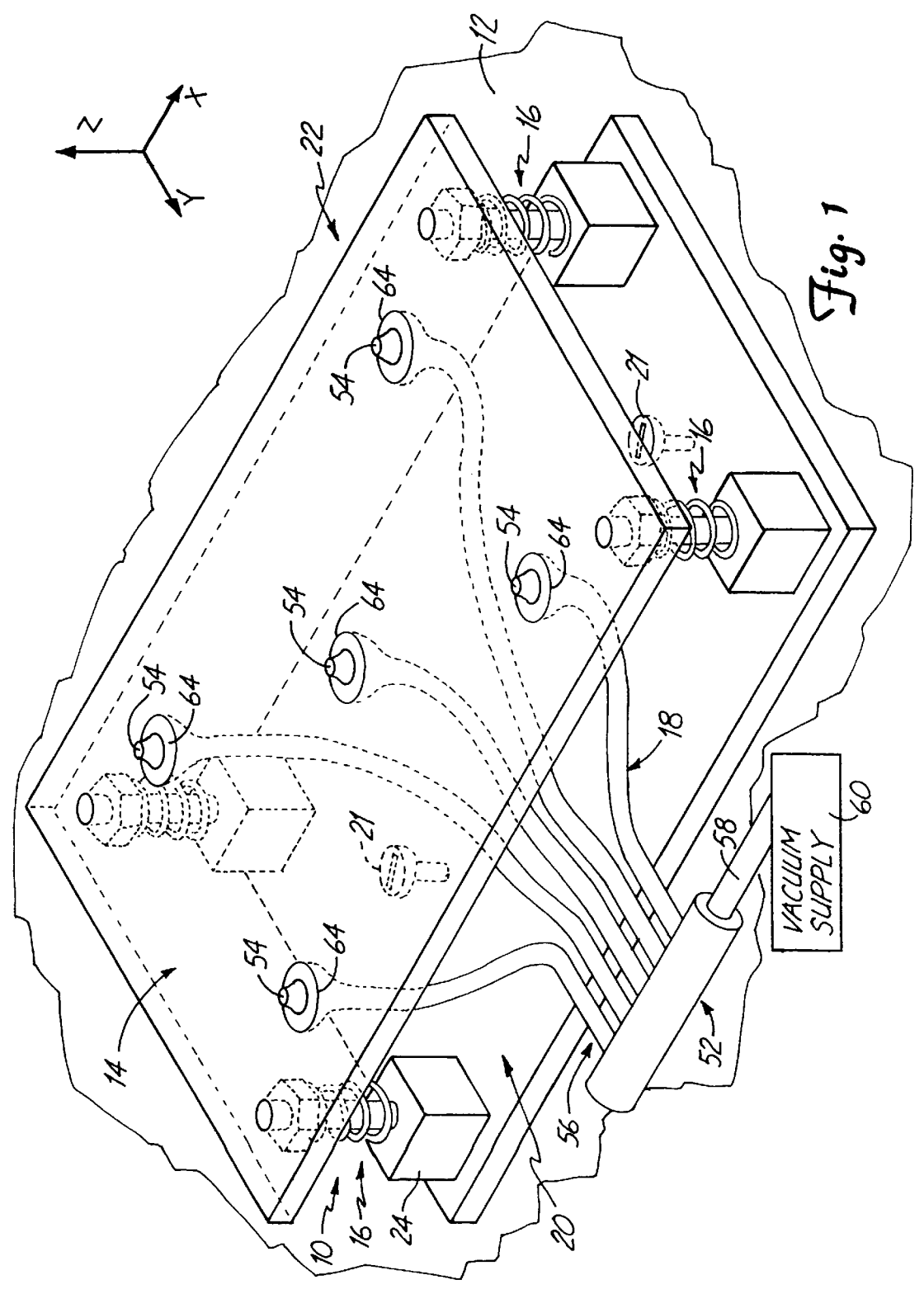
Figure 4:
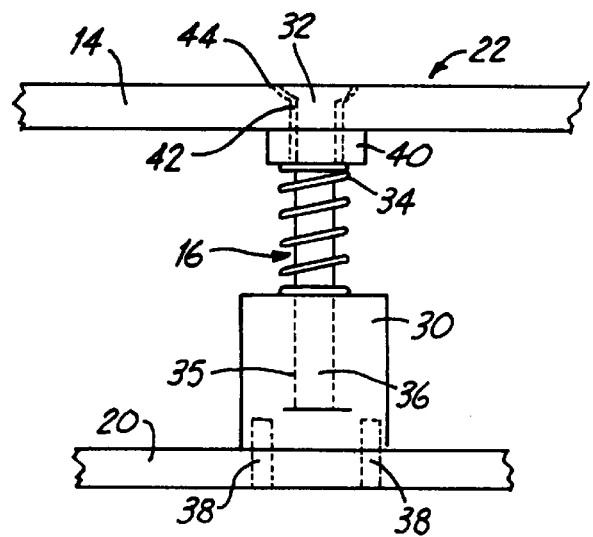
FIG. 4 is a side view of an alternative leg embodiment of the platform shown in FIG. 1.

Referring to the embodiment of the invention shown in FIG. 1, there is shown a platform, referred to in its entirety as 10, resting upon a work table 12. The work table 12 may be the tooling table of a of a pick-and-place machine, although it could be any surface used for manufacturing processes. Throughout this specification, "table" will be used to refer to any work surface for which a platform may be needed to produce a level and flat upper surface for a workpiece. A typical table 12 is a tooling table of a pick-and-place machine upon which a printed circuit board (PCB) may be secured for surface mounting of components.

The platform 10 in general comprises a plate 14, at least one leg 16, a fastener 18, and a base 20. The plate 14 is attached to the base 20 by at least one of the legs 16. A PCB 50 may be placed upon the upper surface 22 of the plate 14, as shown in FIGS. 2–6, and secured to the plate 14 with a fastener 18. The upper surface 46 of the PCB 50 may then be leveled to a flat surface that does not vary in the Z plane.

As will be seen, the present arrangement addresses Z-axis alignment of a PCB 50 as two distinct but related issues that need to be resolved. First, there is the issue of Z-axis positioning of the upper surface 46 of the PCB 50, assuming that the upper surface 46 of the PCB 50 is adequately flat. This must be addressed by height and ankle positioning of the PCB 50 as a whole. Second, there is the issue of flatness or evenness over the entire upper surface 46 of the PCB, because a given PCB 50 may not be adequately flat. This must be addressed by "smoothing" the deviations in the PCB's 50 upper surface 46.

A. The Plate of the Platform

In the embodiment of the invention shown in FIG. 1, the plate 14 is generally rectangular in shape. The plate 14, however, could be of any geometry, including a circular shape or a square shape. The plate 14 may be made of any hard, relatively rigid material, such as plastic or aluminum, and the thickness of the plate may vary. The plate's upper surface 22 is substantially flat so that it can provide a reference and a guide for achieving evenness or flatness. As shown in FIGS. 2 and 3, a thin foam layer 23 may be placed upon the upper surface 22 of the plate 14 to help cushion components 48 on the lower surface 45 of a PCB 50 when the PCB 50 is secured to the plate 14. This foam layer 23 may be of varying thickness and may be made from a variety of resilient materials known to those skilled in the art. The plate 14 may also have a variety of holes or grooves formed in it as described in connection with the other elements of the platform 10 in the description that follows.

B. The Legs of the Platform

The platform 10 shown in FIG. 1 has four legs 16, although any number of legs 16 or other supports could be used within the scope of the invention. In the embodiment shown in FIG. 1, the legs 16 connect the plate 14 to the base 20. The base 20, therefore, may be adapted so that it may be secured to the table 12. FIG. 1 shows the base 20 connected to the table 12 using pins 21, although the base 20 may be secured to the table 12 by a variety of devices. The legs 16 also could be used to connect the plate 14 directly to the table 12. The base 20, therefore, is not necessary for the platform 10 to function. If the platform 10 does not contain a base 20, the first end 24 of each leg, which is the bottom portion of the leg 16, may be configured so that it may be secured to the table 12. Each leg 16, therefore, could have a bolt, or any other securing device known to those skilled in the art, to secure the leg 16 to the table 12. The legs 16 shown in FIG. 1 are solid. The first end 24 of each leg 16 is rigidly connected to the base 20. The second end of each leg 16 is rigidly connected to the plate 14. In this embodiment, therefore, the distance between the plate 14 and the base 20 (or table 12) is fixed.

FIG. 4 shows an alternative embodiment of a leg 16 that is adjustable in length. The leg 16 of FIG. 4 is shown connecting the plate 14 to the base 20 of the platform 10. The embodiment of the leg 16 shown in FIG. 4 could be substituted for each leg 16 of FIG. 1, such that the distance and angle between the plate 14 and the base 20 (or table 12) would be adjustable. FIG. 4 illustrates one embodiment of an adjustable leg 16, although those skilled in the art could develop other devices for producing a leg 16 that is adjustable in length without departing from the scope of the invention.

The leg 16 of FIG. 4 in general comprises a mounting bracket 30, a bolt 32, and a spring 34. The mounting bracket 30 may be secured to the base 20 by a variety of devices known to those skilled in the art; FIG. 4 shows mounting bolts 38 used to bolt the mounting bracket 30 to the base 20. In an embodiment that does not include a base 20, the first end 24 of each leg 16, which may be the mounting bracket 30, may be adapted to secure the leg 16 to the table 12 with the mounting bolts 38 or with other devices known to those skilled in the art. In the leg 16 of FIG. 4, a second bolt 32 may extend through the plate 14 and into the mounting bracket 30 to secure the plate 14 to the base 20. If the bottom portion of the bolt 32 is threaded, the bolt 32 may screw into threads 35 formed within a bore 36 in the mounting bracket 30. Advancing or removing the threads 35 from the bore 36 provides adjustability of the height and angle of the upper surface 22 of the plate 14.

The spring 34 may fit over the bolt 32 such that one end of the spring 34 is in contact with the plate 14 and the other end is in contact with the mounting bracket 30. A washer 40 or other similar device may be connected to either the spring 34 or the bottom side of the plate 14 so that the spring 34 provides an even upward force on the plate 14. As shown in FIG. 4, the spring 34 provides an upward force on the plate 14 so that the bolt 32 sits flushly in the top of the plate 14 and so the height of the plate 14 is easy to adjust. The plate 14 may have a receiving area 44 carved into its upper surface so that the top of the bolt 32 sits smoothly upon the upper surface 22 of the plate.

For the adjustability of the legs 16 to work smoothly, the plate 14 may have a bore 42 through its surface that is slightly wider in diameter than the bolt 32. Because the platform 10 may have a plurality of legs 16 (as shown in FIG. 1), the plate 14 may form an angle with the table 12 such that the upper surface 22 of the plate 14 is not flat at a constant Z depth. The bore 42 in the plate 14, therefore, allows the bolt 32 to fit through the plate smoothly even if the plate 14 is at a slight angle to the bolt 32. If both the mounting bracket 30 and the plate 14 were to contain threads matching the bolt 32, it may be difficult to adjust the height of the legs 16 when each of the legs 16 are at different heights and the legs 16 form an angle with the plate 14.

This specification refers to, a first end 24 and a second end 26 for each leg 16. The "first end" 24 of a leg will be used to refer to any part of the leg 16, such as the bolt 32 or mounting bracket 30, that connects the leg 16 to the base 20 (or to the table 12). Similarly, the "second end" 26 of a leg 16 will be used to refer any part of the leg 16, such as the bolt 32 or washer 40, that connects the leg 16 to the plate 14.

As best shown in FIGS. 2 and 3, the legs 16 of the platform 10 allow the height of the plate 14 above the base 20 (or table 12) to be adjusted. The angle ø formed between the plate 14 and the base 20 (or table 12) may also be modified by adjusting the length of the legs 16. FIGS. 2 and 3 illustrate two dimensions (an X-Z axes), although the angles may also be adjusted in the third dimension (Y-axis).

FIG. 2 shows a PCB 50 having components 48 already present on its lower surface 45. When the PCB 50 of FIG. 2 is placed and secured upon the plate 14 (fastener 18 is not illustrated), the PCB 50 forms an angle Ω with the upper surface 22 of the plate 14. The upper surface 22 of the plate 14 shown in FIG. 2 forms a plane parallel to the base 20 (and the table 12), such that the angle ø (not shown in FIG. 2) between the upper surface 22 of the plate 14 and the base 20 (or table 12) is zero. Because the upper surface 46 of the PCB 50 in FIG. 2 is not of uniform height in the Z dimension, the pick-and-place machine may make errors when placing components 48 on the upper surface 46 of the PCB 50.

FIG. 3 shows the placement of the PCB 50 of FIG. 2 upon the platform 10 such that the upper surface 46 of the PCB 50 is of uniform height in the Z dimension. The legs 16 of the platform 10 have been adjusted in length to produce a level upper surface 46 for the PCB 50. The angle Ω between the PCB and the plate 14 remains constant as the angle ø is increased by adjusting the length of the legs 16. The necessity of the adjustment of the angle ø in FIGS. 2 and 3 resulted from a PCB 50 with components 48 mounted on its lower surface 45. The adjustability of the legs 16 to alter the angle ø may also be necessitated by severe warping of different areas of the PCB 50, by varying thicknesses of the PCB 50, or by other factors.

The orientation of the plate 14 upon the legs 16 may be locked into fixed positions. FIGS. 2 and 3 show the use of lock nuts 39 near the mounting brackets 30. These lock nuts 39 could be used to fix the positions of the bolts 32 within the bores 36. This allows the platform 10 to be set up for a given line of PCB 50 production once at the beginning of a production run. The platform 10 may then be locked into position and used to produce a repeatable flat upper surface for the entire production run. The platform 10 may also be moved from one machine to another machine handling the same line of PCBs 50 without the need for burdensome alignment procedures to produce a flat surface. As described above, if the bolt 32 is rotated so that the position of the bolt 32 within the mounting bracket 30 is modified, the height of the plate 14 above the base 20 (or table 12) will change. When the rotation of the bolt 32 is completed, the leg 16 will lock into position (if the bolt 32 is not rotated) so that the height of the leg 16 is fixed.

In the embodiment of FIG. 1, where the legs 16 are fixed in position, the legs 16 would be pre-fit in height for a given line of PCBs so that the upper surface 46 of the PCBs 50 would have the desired uniform Z-axis dimension.

C. The Fastener of the Platform

The platform 10 shown in FIG. 1 contains a fastener 18 to secure a PCB 50 to the upper surface 22 of the plate 14. FIGS. 2–6 illustrate a PCB 50 resting upon the upper surface 22 of the plate 14. Throughout this specification, "fastener" 18 will be used to refer to any device or devices used to secure a PCB 50 in a substantially flat position on the upper surface 22 of the plate 14. The fastener 18 could be a plurality of clamps that pinch the PCB 50 to secure it upon the plate 14, or any other device known to those skilled in the art to secure the PCB 50 upon the plate 14.

The fastener 18 shown in FIG. 1 comprises a suction system, referred to in its entirety as 52. Throughout this specification, "suction system" will be used to refer to any device capable of securing the PCB 50 to and against the plate 14 through the use of suction forces. The suction system 52 of FIG. 1 comprises one or more vacuum nozzles 54 and a vacuum supply 56, which may comprise a hose 58 connected to a vacuum source 60. The vacuum source 60 may permit for the adjustment of the amount of vacuum applied. Some pick-and-place machines come equipped with vacuum supplies 56, while other machines do not. If a pick-and-place machine is equipped with a vacuum supply 56, that supply may be connected directly to the vacuum nozzles 54.

Figure 6:
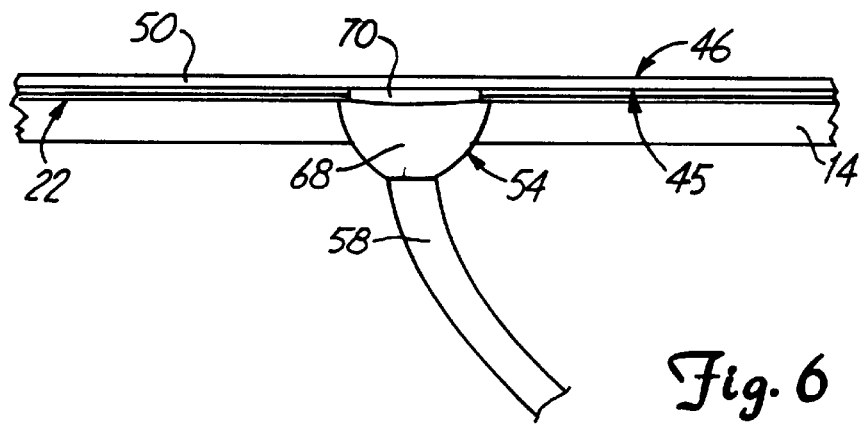
FIG. 6 is a side view of the plate of the embodiment shown in FIG. 1 that illustrates the vacuum nozzle of the platform reducing the warping of the PCB to produce a flat upper surface.
Figure 7:
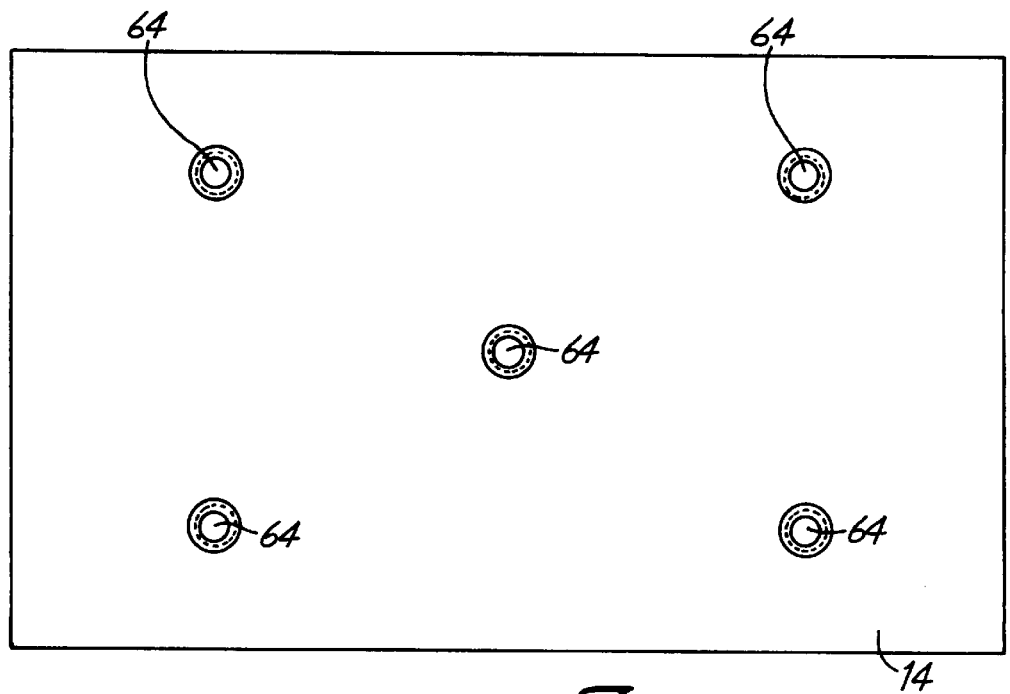
Fig. 7 is a top view of an alternative embodiment of the plate.

As best shown in FIG. 7, the plate 14 may have one or more holes 64 in which the vacuum nozzles 54 fit. A hole 64 in the plate 14 may have threads 66 around its edges to secure the vacuum nozzle 54 within the hole 64. In this embodiment, the vacuum nozzle 54 may have matching threads 68 (best shown in FIGS. 5 and 6) so that it may be secured within the holes 64 of the plate 14. Any method known to those skilled in the art to secure the vacuum nozzles 54 within the holes 64 may be used. In one embodiment, the vacuum nozzle 54 might not have threads 68. Instead, the vacuum nozzle 54 could fit in a threaded bolt with a hole through it, and the threaded bolt could then be secured in a hole 64 of the plate 14. The vacuum nozzles 54 used in the invention may vary as known to those skilled in the art.

Figure 5:
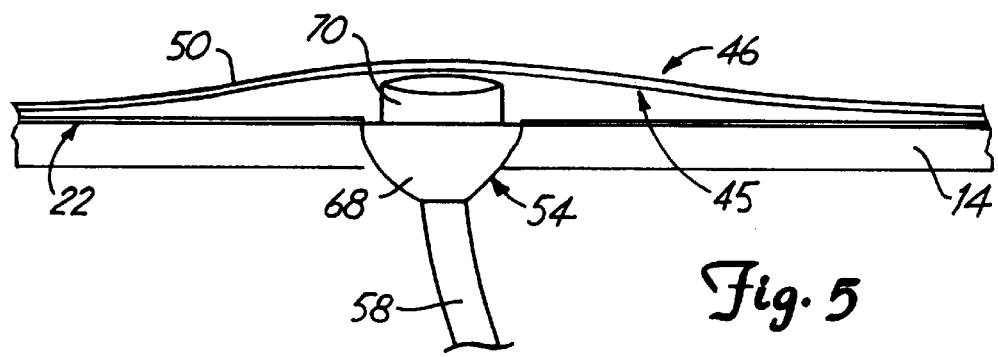
FIG. 5 is a side view of the plate of the embodiment shown in FIG. 1 that illustrates the warping of a PCB.

The operation of the suction system 52 to secure the PCB 50 to the plate 14 is best shown in FIGS. 5 and 6. FIG. 5 shows a warped PCB 50 resting upon the upper surface 22 of the plate 14. The vacuum nozzle 54 of FIGS. 5 and 6 contains a bellow cup 70 that extends above the upper surface 22 of the plate 14. When the power to the suction system 52 is turned on (FIG. 6), the bellow cup 70 grips the lower surface 45 of the PCB 50. The suction force produced by the vacuum source 60 (shown in FIG. 1) suctions the lower surface 45 of the PCB 50 down until the lower surface 45 comes into contact (or very near contact) with the upper surface 22 of the plate 14. As the bellow cup 70 grips the PCB 50, the bellow cup 70 itself contracts such that the mouth of the bellow cup 70 is lowered to near the upper surface 22 of the plate 14.

If the PCB 50 contains components 48 on its lower surface 45, as in FIGS. 2 and 3, these components will come into contact with the upper surface 22 of the plate 14 when the power to the vacuum source 60 is turned on. In this case one or more bellow cups 70 may continue to extend above the upper surface 22 of the plate 14. This makes achieving evenness somewhat more difficult because the upper surface 22 of the plate 14 can no longer serve as a single reference for flatness against which the PCB 50 can be forced. However, it can still serve as a visual reference that may be of assistance to an operator, particularly if it is possible to regulate the degree of vacuum so that no vacuum nozzle 54 induces a new degree of unevenness in the flatness of the PCB 50.

Referring again to FIGS. 5 and 6 (which show a PCB 50 without components on its lower surface 45), the upper surface 46 of the PCB 50 will become substantially flat if a plurality of the vacuum nozzles 54 grip the PCB's lower surface 45 to bring the PCB 50 into flat contact with the upper surface 22 of the plate 14 (a flat reference). In one embodiment of the suction system 52, therefore, a plurality of vacuum nozzles 54 may be connected to the vacuum source 60 by hoses 58. The use of a plurality of vacuum nozzles 54 to grip the PCB 50 planerly secures the PCB 50 to the plate 14. Throughout this specification, the term "planerly secured" will be used to refer to securing a PCB 50 to the plate 14 such that the upper surface 46 of the PCB 50 becomes flat.

FIGS. 1 and 7 show embodiments of the plate 14 that include a plurality of holes 64 into which the vacuum nozzles 54 fit. Each hole 64 in the plate 14 contains a mechanism, such as threads 66, to connect a vacuum nozzle 54 to the hole 64. In this embodiment, the location of the vacuum nozzles 54 will be fixed. In an alternative embodiment, shown in FIG. 8, the plate 14 may have one groove 80 or a series of grooves 80 in which the vacuum nozzles 54 may be mounted. Each groove 80 may contain one or more vacuum nozzles 54. The vacuum nozzles 54 may be placed in any location within the grooves 80 so that the vacuum nozzles 54 are located in the best position below a given PCB 50 to grip the PCB 50, to avoid contact with components 48, and to planerly secure the PCB 50 to the plate 14.

Figure 8:
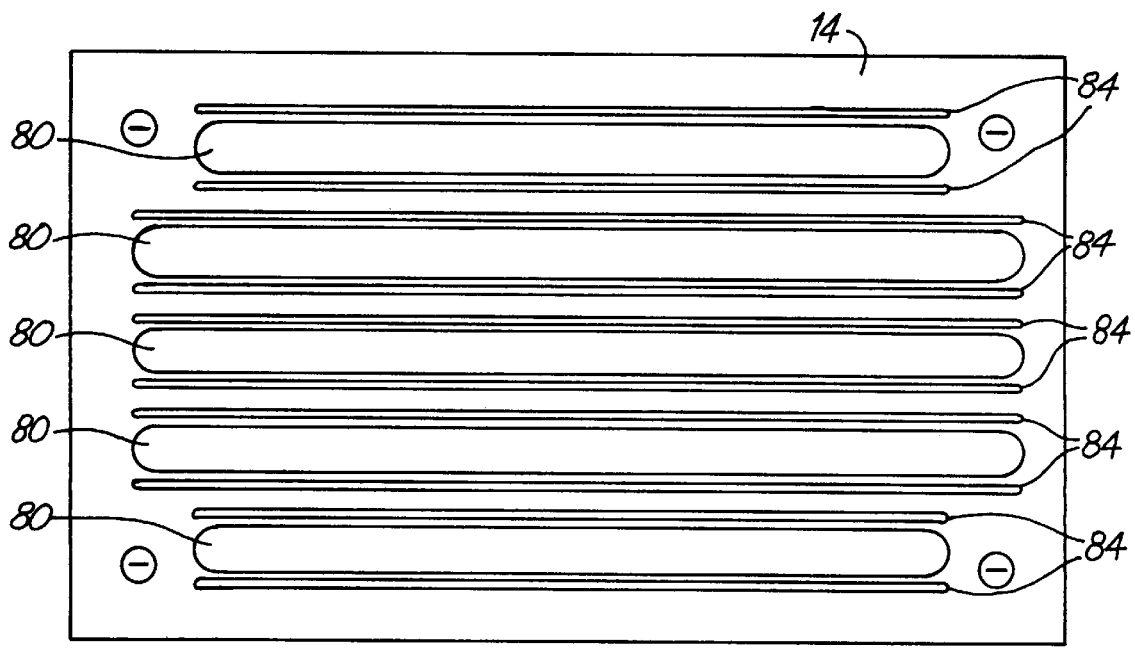
FIG. 8 is a top view of a second alternative embodiment of the plate.
Figure 9:
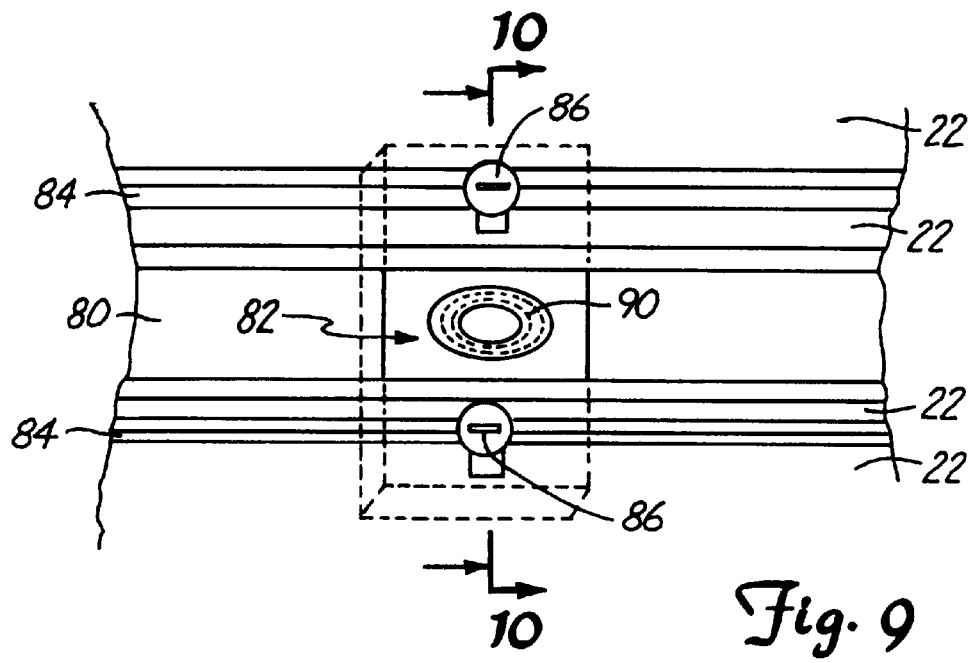
FIG. 9 is a perspective view of a nozzle placement guide mounted in the plate for use with the second alternative embodiment of FIG. 8.

In the embodiment of FIG. 8, a nozzle placement guide 82 may be used to secure each vacuum nozzle 54 in the proper location within a groove 80. FIG. 9 shows one embodiment of a nozzle placement guide 82 mounted within a groove 80 in a plate 14 with upper surface 22. The nozzle placement guide 82 comprises a block of metal or rigid plastic with a placement hole 90 for a vacuum nozzle 54, and two bolts 86 to hold the nozzle placement guide 82 to the plate 14. The placement hole 90 may be threaded to receive a vacuum nozzle 54 to secure the vacuum nozzle 54 within the nozzle placement guide 82. In one embodiment of the nozzle placement guide 82, the placement hole 90 may not extend entirely through the nozzle placement guide 82. Instead, the placement hole 90 could extend only partly into the nozzle placement guide 82, and a port hole in the side or bottom of the nozzle placement guide 82 could be used to connect the nozzle placement guide 82 to a hose 58, which would in turn be connected to a vacuum source 60. Other devices known to those skilled in the art may also be used to attach a vacuum nozzle 54 to a nozzle placement guide 82.

Figure 10:
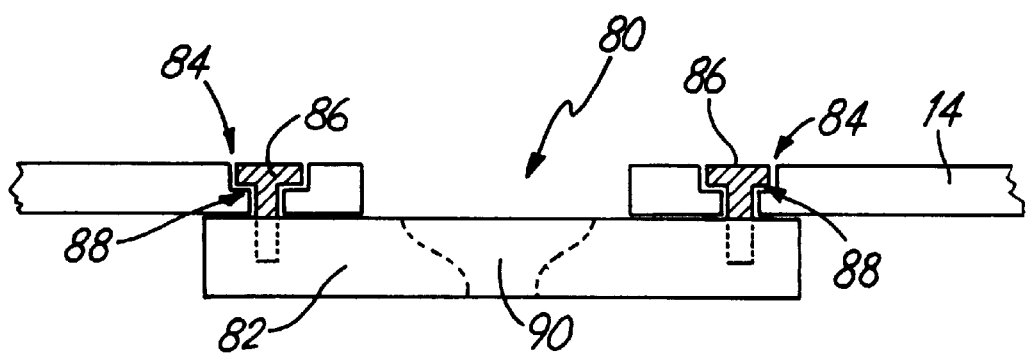
FIG. 10 is a cross-sectional view taken along lines 10—10 of FIG. 9.

Each groove 80 of the plate 14 shown in FIG. 8 is flanked by two placement channels 84, one on either side of the groove 80. Referring again to FIG. 9, the nozzle placement guide 82 is bolted with bolts 86 into the placement channels 84. As shown in FIG. 10, the placement channels 84 may have a stepped ridge 88 that provides a surface upon which the bolts 86 may rest. The bolts 86 may be loosened so that the location of the nozzle placement guide 82 within the groove 80 may be modified. The embodiment of the plate 14 shown in FIG. 8, therefore, may be used in combination with the nozzle placement guide 82 shown in FIGS. 9 and 10 to allow for the adjustment of the location of the vacuum nozzles 54 underneath the PCB 50. Once the proper positioning of the nozzle placement guides 82 in the plate 14 is found, the nozzle placement guides 82 may be locked in place so that the layout of the vacuum nozzles 54 will be fixed for a given line of PCB 50 production.

As can be seen, while the plate 14 is still flat and still serves as the reference for evenness of the PCB 50, it does not provide support for the PCB 50 at all points. The grooves 80 and channels 84 represent areas where the plate 14 does not provide support; thus, these must be narrowly dimensioned and dispersed in such a manner that, given the flexing qualities of the PCB 50 with which the plate 14 will work, the vacuum nozzles 54 do not introduce new deviations from unevenness. With this placement the upper surface 22 of the plate 14 still functions as the flatness guide and reference.

D. Operation of the Platform

The present invention provides a method and an apparatus for securing a PCB 50 to a table 12 with a desired Z-axis dimension and for leveling the upper surface 46 of the PCB 50. The invention accomplishes this by fastening the PCB 50 to a plate 14 of the platform 10, securing the platform 10 to the table 12, and adjusting the upper surface 46 of the PCB 50 to produce a flat, level surface. As described above, the PCB 50 may be adjusted to a flat, level surface through the adjustment of legs 16 on the platform 10 that alter the angle of the plate 14 in relation to the base 20, and by planerly securing the PCB 50 to the plate 14 through the use of suction forces.

In order to adjust and lock the height of the legs 16 of the platform 10, a template, which is a PCB 50 that is identical in shape and orientation to a line of PCBs 50 to be produced, may be secured to the plate 14 using the suction system 52. Holes can be drilled in the template above each bolt 32 in the plate 14 so that the length of the legs 16 may be adjusted. The legs 16 may then be adjusted by rotating the bolt 32 through the hole in the template without having to remove the template from the plate 14. This adjustment procedure allows a machine operator to adjust the legs 16 of the platform 10 with the template, which is identical to a PCB 50, remaining attached to the plate 14. The plate 14, therefore, does not have to be larger than a line of PCBs 50 for the legs 16 of the platform 10 to be adjusted. After the legs 16 are adjusted, the template may be replaced by a PCB 50 prior to a production run. This adjustment procedure may save space on the table 12 by allowing the plate 14 to be smaller in width than the line of PCBs 50 to be populated with components 48.

This invention allows the user to achieve a flat upper surface 46 of a PCB 50 for population of components using a pick-and-place machine. In one embodiment, the platform 10 is not dedicated for a given line of PCBs 50; it may be adjustable so that it may be used for a variety of PCB 50 production lines. The flat upper surface 46 may be locked into place so that the platform 10 may be moved from one machine to another without requiring burdensome adjustments to reproduce a flat upper surface 46 for the PCB 50. The invention also reduces the likelihood of damage to components mounted to the lower surface 45 of PCBs 50 and helps induce a flat upper surface 46 for PCBs 50 that are warped or are of varying thickness.

While the present invention has been described with reference to several embodiments thereof, those skilled in the art will recognize various changes that may be made without departing from the spirit and scope of the claimed invention. Accordingly, this invention is not limited to what is shown in the drawings and described in the specification but only as indicated in the appended claims.

What is claimed is:

1. A platform for leveling the upper surface of a printed circuit board placed upon a work table, the platform comprising:
   (a) a substantially flat plate, the plate having a suction system for planerly securing the printed circuit board thereto, wherein the suction system contains at least one suction device adjustably coupled to the plate so that the postion of the suction device with respect to the plate may be altered; and
   (b) at least one support having a length between a first end and a second end, the second end of the at least one support attached to the plate, wherein the length of the at least one support is selected such that an angle between the plate and the work table compensates for an angular displacement of the printed circuit board relative to the plate, the at least one support comprising a mounting bracket to adjust the length between the first and second end.

2. The platform of claim 1 wherein the first end of the at least one support is adapted to be mounted to the work table.

3. The platform of claim 1 wherein the at least one support is a solid unit and the second end of the at least one support is rigidly connected to the plate.

4. The platform of claim 1 further comprising a base adapted to be mounted to the work table, and wherein the first end of the at least one support is connected to the base.

5. The platform of claim 1 wherein the second end of the at least one support comprises a bolt extending through the plate and into the mounting bracket to support the plate.

6. The platform of claim 5 wherein the bolt includes threads and wherein the mounting bracket includes a bore with receiving threads matching the threads of the bolt, such that rotation of the bolt causes the bolt to move and alters the height of the plate above the base.

7. The platform of claim 5 wherein the at least one support further comprises a spring placed over the bolt and between the plate and the mounting bracket such that when the spring is compressed it applies an upward force on the plate, and wherein the plate locks into a fixed position upon alteration of the position of the bolt in the mounting bracket.

8. The platform of claim 7 wherein the plate is generally rectangular in shape and wherein there is one support connected to each of the four corners of the plate.

9. The platform of claim 1 further comprising a foam layer attached to the upper surface of the plate.

10. The platform of claim 1 wherein the suction system comprises a vacuum nozzle that may be connected to a vacuum supply.

11. The platform of claim 10 wherein the vacuum supply is adjustable.

12. The platform of claim 10 wherein the plate has at least one hole therein and the vacuum nozzle fits through the hole of the plate, and wherein the vacuum nozzle is adapted for gripping the printed circuit board and bringing the printed circuit board into contact with the upper surface of the plate.

13. The platform of claim 10 wherein the plate has at least one groove therein and further comprising a nozzle placement guide that fits within the groove to hold the vacuum nozzle, and wherein the vacuum nozzle is adapted for gripping the printed circuit board and bringing the printed circuit board into contact with the upper surface of the plate.

14. A platform for leveling the upper surface of a printed circuit board placed upon a work table, the platform comprising:
   (a) a flat plate;
   (b) a suction system to planerly secure the printed circuit board to the plate, wherein the suction system contains at least one suction device adjustably coupled to the plate so that the position of the suction device with respect to the plate may be altered;
   (c) a base adapted to be mounted to the work table; and
   (d) a plurality of supports having lengths between first ends and second ends, the first ends connected to the base, the second ends connected to the plate, and wherein the lengths of the plurality of supports are selected such that an angle between the plate and the work table compensates for any angular displacement of the printed circuit board relative to the plate, at least one of the supports comprising a mounting bracket to adjust the length between the first and second ends.

15. The platform of claim 14 wherein the plurality of supports are adjustable in length.

16. The platform of claim 15 wherein the second ends of the plurality of supports are movably connected to the plate.

17. The platform of claim 14 wherein the second ends of the plurality of supports comprise a bolt extending through the plate and into the mounting bracket to support the plate.

18. The platform of claim 17 wherein the suction system comprises at least one vacuum nozzle to grip the printed circuit board and to planerly secure the printed circuit board against the plate.

19. The platform of claim 18 wherein the plate contains a hole for each of the at least one vacuum nozzles, the plate further having threads around each of the holes so that the at least one vacuum nozzle fits securely in the at least one hole while gripping the printed circuit board flat against the plate.

20. The platform of claim 18 wherein the plate contains at lest one groove therein and further comprising a nozzle placement guide that fits within the at least one groove to hold the vacuum nozzle, and wherein the vacuum nozzle is adapted for gripping the printed circuit board and bringing the printed circuit board into contact with the upper surface of the plate.

21. The platform of claim 17 further comprising a foam layer attached to the upper surface of the plate.

22. The platform of claim 20 wherein the position of the vacuum nozzle may be altered by moving the vacuum nozzle in the at least one groove.

* * * * *